United States Patent [19]

Hoshino et al.

[11] Patent Number: 4,644,279
[45] Date of Patent: Feb. 17, 1987

[54] DIAGNOSTIC APPARATUS EMPLOYING NUCLEAR MAGNETIC RESONANCE

[75] Inventors: Kazuya Hoshino; Noriaki Yamada; Eiji Yoshitome; Tadashi Sugiyama; Hiroyuki Matsuura, all of Tokyo, Japan

[73] Assignees: Yokogawa Hokushin Electric Corporation; Yokogawa Medical Systems, Ltd., both of Tokyo, Japan

[21] Appl. No.: 717,523

[22] Filed: Mar. 29, 1985

[51] Int. Cl.$^4$ ............................................. G01R 33/20
[52] U.S. Cl. ...................................... 324/309; 324/307
[58] Field of Search ............... 324/300, 307, 306, 309, 324/312, 313, 314

[56] References Cited

U.S. PATENT DOCUMENTS 4,577,152  3/1986  Macovski ............................. 324/309
4,579,121  4/1986  Macovski ............................. 324/309

Primary Examiner—Michael J. Tokar
Attorney, Agent, or Firm—Moonray Kojima

[57] ABSTRACT

After spins in a subject being examined have been selectively excited, the application of gradient magnetic fields is interrupted to produce an FID signal. The intensity of the primary magnetic field is determined based on the central frequency of the Fourier spectrum of the FID signal, i.e., the Larmor frequency. The primary magnetic field is controlled or the observed data is corrected, according to the measured value of the primary magnetic field intensity.

5 Claims, 7 Drawing Figures

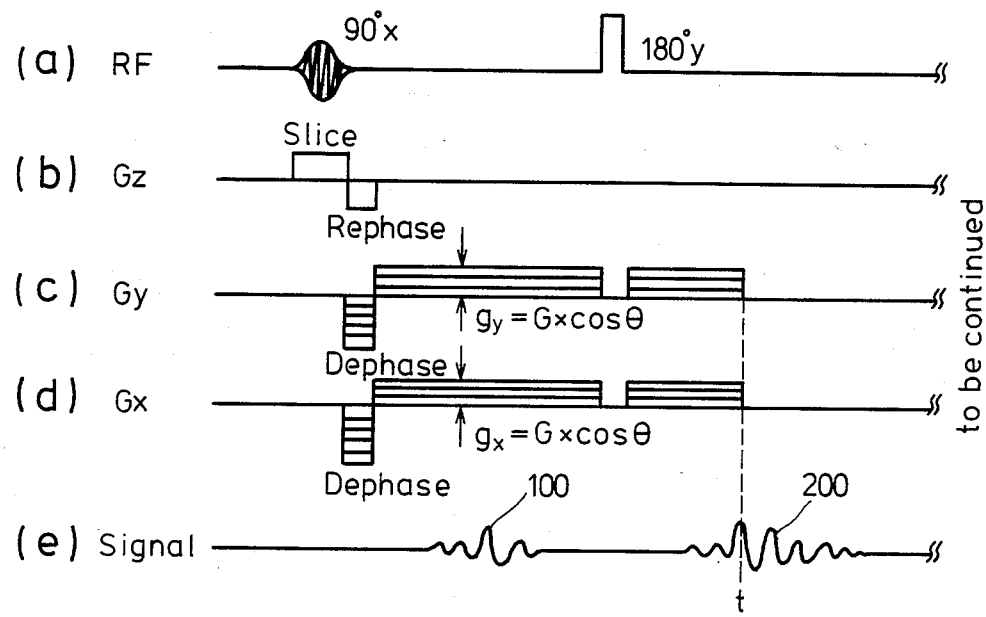
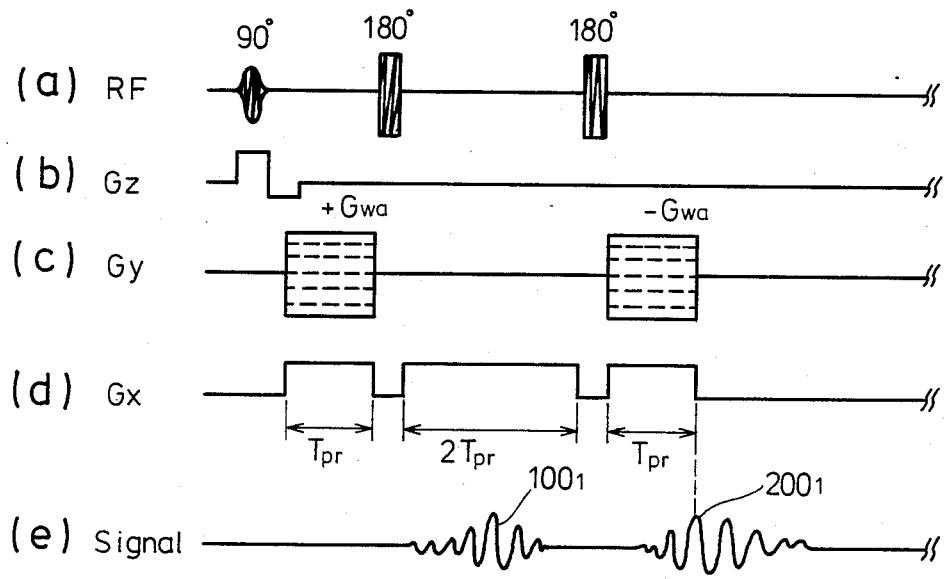

DIAGNOSTIC APPARATUS EMPLOYING NUCLEAR MAGNETIC RESONANCE

BACKGROUND OF INVENTION

1. Field of Invention

This invention relates to a diagnostic apparatus employing nuclear magnetic resonance (NMR), and more particularly, to means for preventing the image quality from being degraded due to time-dependent variations of the primary magnetic field intensity in an NMR computerized tomographic apparatus.

2. Description of the Prior Art

Conventional NMR diagnostic apparatus, such as NMR computerized tomographic apparatus, generate a primary magnetic field by energizing a primary magnetic field coil with a constant current. However, the primary magnetic field coil may vary in its shape due to variations in the primary magnetic field power supply, or in the room temperature, or in the temperature of the primary magnetic field coil per se, with the result that the intensity of the primary magnetic field varies in intensity, the image of a diagnosed area is liable to suffer from an artifact.

SUMMARY OF THE INVENTION

Accordingly, an object of the invention is to provide an NMR diagnostic apparatus having means for preventing artifacts from being generated due to variations in the primary magnetic field.

The foregoing and other objects are attained by the invention, wherein the application of a gradient magnetic field is interrupted and the intensity of the primary magnetic field is measured. Then, based on the measured value, the intensity of the primary magnetic field is controlled, or a computed value is corrected, or the reference frequency of a phase detection is controlled. The primary magnetic field intensity is measured when an NMR signal from the subject being examined is observed.

BRIEF DESCRIPTION OF THE DRAWING

FIG. 6 is a timing chart depicting a pulse sequence used in the invention.

FIG. 7 is a timing chart depicting another pulse sequence used in the invention.

DESCRIPTION OF THE PREFERRED EMBODIMENTS

Figure 1:
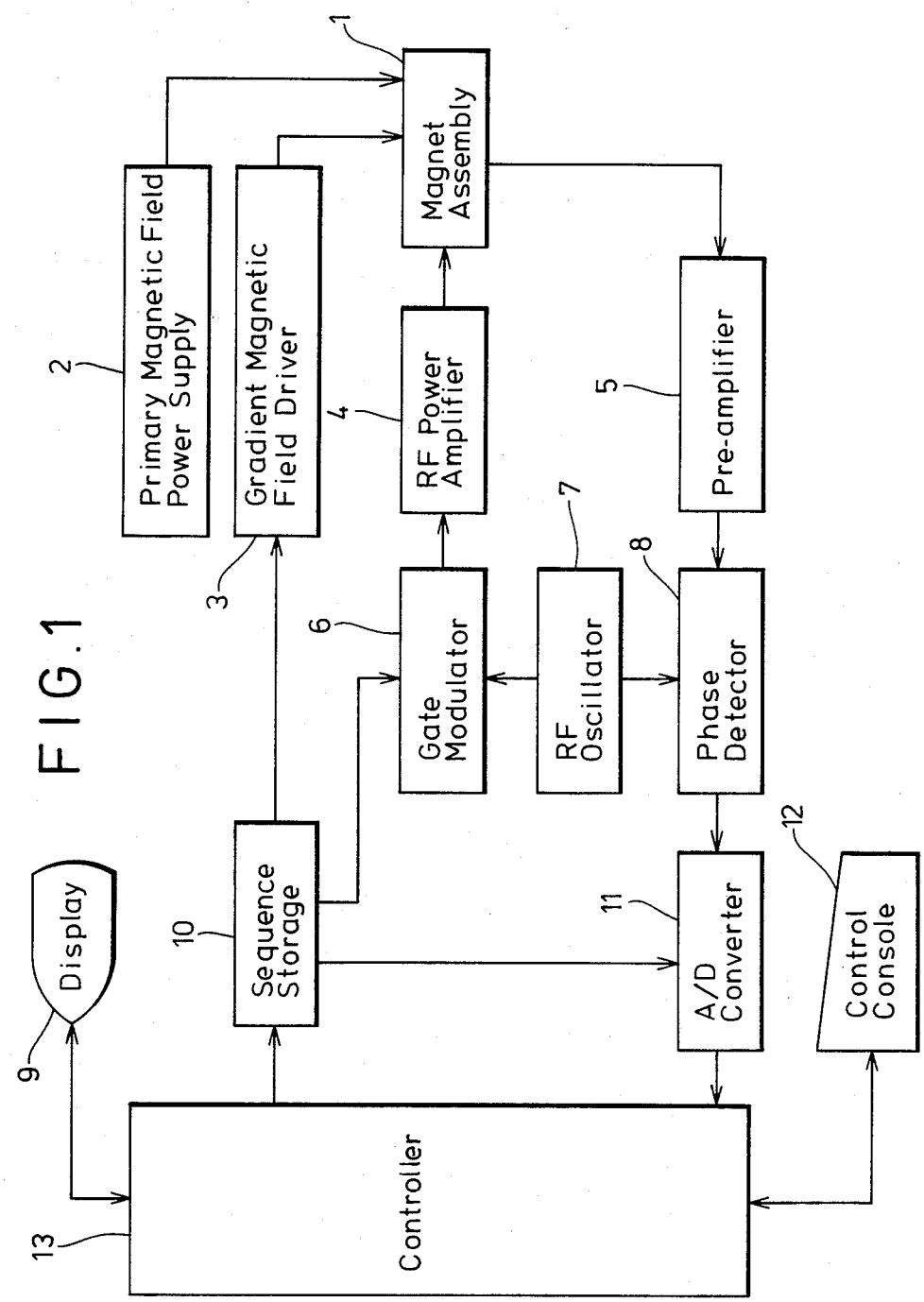
FIG. 1 is a block diagram depicting an illustrative embodiment of the invention, comprising an NMR diagnostic apparatus.

Turning now to FIG. 1, which illustrates a diagnostic apparatus of the invention, incorporated, for example, in an NMR computerized tomographic apparatus.

The apparatus comprises a magnetic assembly 1, which has a space or hole therein for inserting a subject to be examined. Magnet assembly 1 comprises a primary magnetic field coil for applying a constant magnetic field to the subject being examined; and x-, y-, and z-gradient magnetic field coils for independently generating gradient magnetic fields Gx, Gy, Gz. The primary and gradient magnetic field coils are disposed in surrounding relation to the space in the magnetic assembly. The assembly 1 also has an RF transmission coil for applying RF pulses to excite the spinning of nuclei in the subject, and a receiving coil for receiving an NMR signal from the subject.

The primary magnetic field coil, the gradient magnetic field coils, the RF transmitting coil, and the NMR signal receiving coils are connected, respectively, to a primary magnetic field power supply 2, a gradient magnetic field driver 3, an RF power amplifier 4, and a preamplifier 5. A sequence storage unit 10 controls the sequence in which the gradient magnetic fields and the RF magnetic field are generated, and also controls the timing with which the generated NMR signal is converted into a digital signal.

A gate modulator 6 is responsive to a timing signal from sequence storage unit 10 for modulating the RF signal from the RF oscillator 7 to produce RF pulses, which are applied to RF power amplifier 4.

A phase detector 8 detects the phase of the NMR signal detected by the receiving coil and delivered through preamplifier 5, with reference to an output signal from RF oscillator 7.

An analog-to-digital (A/D) converter 11 converts the NMR signal from phase detector 8 into a digital signal.

A controller 13, which includes a computer, is suitably programmed and serves to supply sequence storage unit 10 with scanning conditions to achieve various scanning modes, to reconstruct a distribution of information on resonance energy as an image based on the observed data from A/D converter 11, and feeds and receives information to and from a control console 12.

A reconstructed image is generated by the controller 13 and then is displayed on a display unit 9.

The operation of the diagnostic apparatus thus far described is as follows. First, a mode of operation for measuring the magnetic field intensity will be described with reference to the pulse sequence shown in FIG. 2.

Figure 2:
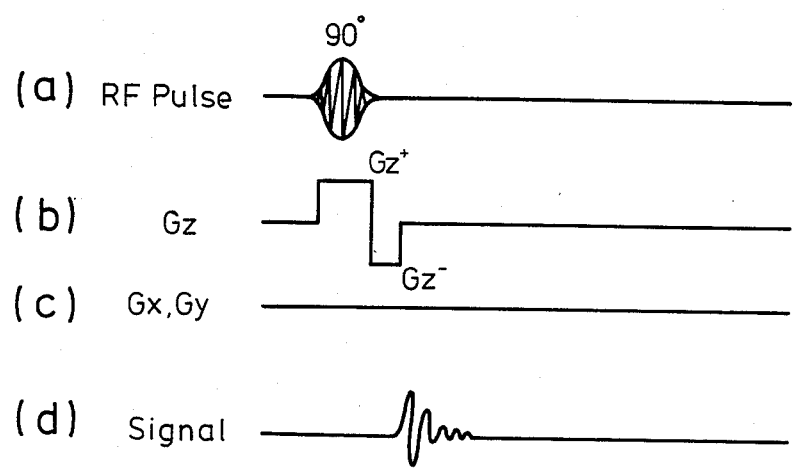
FIG. 2 is a timing chart depicting a pulse sequence during a magnetic field intensity measuring view.
Figure 3:
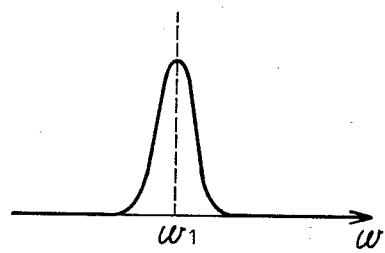
FIG. 3 is a diagram depicting the Fourier spectrum of an FID signal obtained during the magnetic field intensity measuring view.

The primary magnetic field coil is energized by primary magnetic field power supply 2 to apply a static magnetic field Ho to the subject placed in magnetic assembly 1. Under this condition. gradient magnetic field driver 3 is controlled by sequence storage unit 10 to energize the z-gradient magnetic field coil for applying a z-gradient magnetic field Gz+ as shown in FIG. 2, line b. At the same time, an RF pulse (FIG. 2, line a) selected and issued by gate modulator 6 is fed through RF power amplifier 4 to the RF transmitting coil for selectively exciting the spin in a sectional or sliced plane of the subject being examined.

Then, after the z-gradient magnetic field Gz+ has been applied a magnetic field Gz− is applied as illustrated in FIG. 2, line b, to bring NMR signals from different areas of the subject into phase with each other.

The application of the z-gradient magnetic field is stopped so that no gradient magnetic field is applied in any one of the x, y, and z directions (FIG. 2, lines b, and c). As a result, the excited spin rotates at a single frequency determined by the primary magnetic field applied at this time. An FID signal thus obtained is Fourier transformed and corrected in phase, whereupon a linear spectrum would ideally be obtained. However, in reality, a spread spectrum is obtained, such as shown in FIG. 2, line d, because of the influence, for example, of an irregularity of the primary magnetic field.

The central frequency of the spectrum, i.e., Larmor frequency $\omega_1$, gyromagnetic ratio $\gamma$, and the primary magnetic field intensity B have the following relationship:

$$\omega_1 = \gamma B \quad (1)$$

Thus, the primary magnetic field intensity can be determined by the arithmetic operation above shown. Thus, magnetic field intensity views are inserted appropriately during the scanning to measure the primary magnetic field intensity for thereby controlling the reference frequency or to correct the data.

The frequency measured by the apparatus of the invention is indicated by phase detector 10 as a difference with the reference frequency $\omega_0$. The peak after the Fourier transform appears at frequencies $\omega_1 - \omega_0$. However, frequency $\omega_1$ prior to the detection will be used for purposes of illustration.

Based on the measured value of the primary magnetic field intensity, controller 13 controls the primary magnetic field power supply 2, or the reference frequency, or corrects the data, thereby to achieve the desired results.

CONTROL OF REFERENCE FREQUENCY

Figure 4:
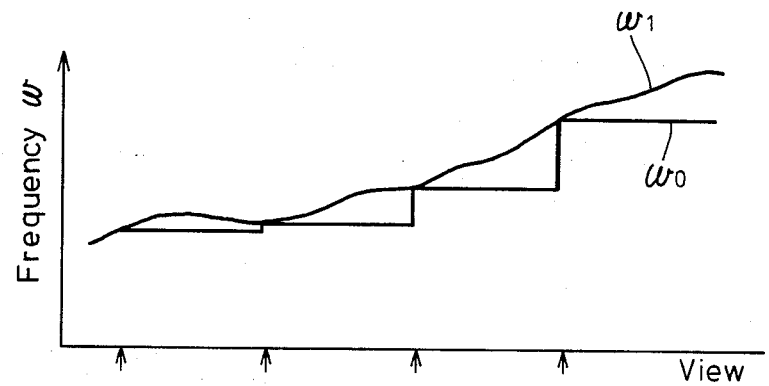
FIG. 4 is a diagram depicting the manner in which a reference frequency $\omega_0$ is corrected.

FIG. 4 shows the manner in which the reference frequency is varied.

As the primary magnetic field intensity varies, the Larmor frequency $\omega_1$ varies, and the reference frequency $\omega_0$ is brought into conformity with the Larmor frequency $\omega_1$, at respective magnetic field intensity viewings, as indicated by the arrows in FIG. 4. This prevents the phase detected signal from being affected by the variation of the primary magnetic field intensity.

For varying reference frequency $\omega_0$, the oscillation frequency of RF oscillator 6 is controlled so as to coincide with the Larmor frequency $\omega_1$ obtained at the time of the magnetic field intensity measuring view, thereby to change the reference frequency of phase detector 8.

The above correcting process corrects the reference frequency $\omega_0$ during the timing of the magnetic field intensity measuring views. Thus, reference frequency $\omega_0$ varies in a step wise manner, as shown in FIG. 4.

CORRECTION OF OBTAINED DATA

Correction of the obtained data will now be described. Although a projection method will be described, there are other correcting methods available for various scanning methods. In the projection method, the variations of the primary magnetic field intensity appears as a frequency shift of the observed data. Providing that the frequency difference between Larmor frequency $\omega_1$ given by the primary magnetic field intensity and the reference frequency $\omega_0$ is given by $\Delta\omega$, observed data f(t) when $\Delta\omega=0$ and observed data f'(t) when $\Delta\omega \neq 0$ have the following relationship:

$$f'(t) = f(t)\exp(-j\Delta\omega t) \quad (2)$$

Thus, the observed data may be corrected according to formula (2).

Figure 5:
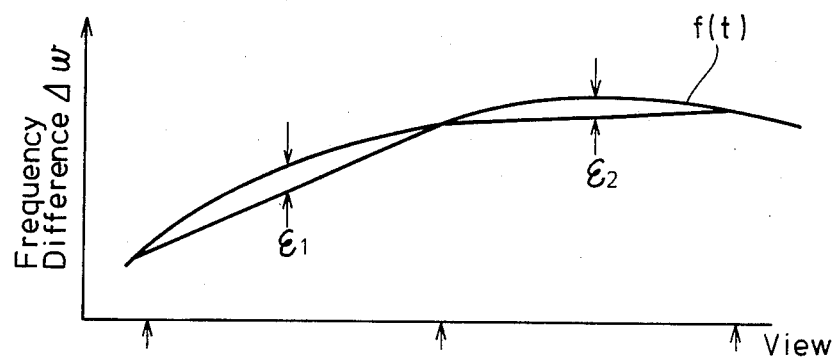
FIG. 5 is a diagram depicting the manner in which observed data is corrected.

FIG. 5 shows the manner in which the observed data is corrected.

The observed data f'(t) is corrected in the following manner using the frequency difference $\Delta\omega$ between Larmor frequency $\omega_1$ and reference frequency $\omega_0$:

$$f(t) = f'(t)\exp(j\Delta\omega t) \quad (3)$$

Equation (3) indicated that f'(t) is frequency shifted by $-\Delta\omega$. For a variation in the magnetic field intensity from a measurement of the primary magnetic field intensity to a next measurement thereof, $\Delta\omega$ is required to be estimated by appropriate interpolation. FIG. 5 shows an example of linear interpolation, wherein magnetic field measuring views are inserted at such time intervals that an estimated error $\epsilon_i (i=1,2,\ldots)$ in each interval will be kept within a certain range. The correction of data in interval 1 is possible after the second magnetic field measuring view, that is, at a time when interval 2 is being scanned. Thus, the scanning and image reconstruction can be effected at the same time.

The observed data can be corrected independently. As the deviation of the magnetic field becomes larger, however, a sliced plane is shifted. Thus, the data correction should preferably be combined with the method wherein the reference frequency $\omega_0$ is varied.

PRIMARY MAGNETIC FIELD MEASUREMENTS

FIG. 6 illustrates a pulse sequence used in the invention.

The spins in the sectional plane of the subject are selectively excited by the gradient magnetic field Gz (FIG. 6, line b) in the z direction and the RF pulse 90°x (FIG. 6, line a) which serves to rotate the spins through 90°. Then, the gradient magnetic field Gx (FIG. 6, line d) in the x direction and the gradient magnetic field Gy (FIG. 6, line c) in the y direction are applied to disperse the directions of magnetization in the sectional plane. Subsequently, gradient magnetic fields $g_x = G \sin\theta$, $g_y = G \cos\theta$, having a sign opposite to that of the gradient magnetic fields used for dispersing the directions of magnetization and also having a constant amplitude ratio are applied to produce a first echo signal 100 (FIG. 6, line e) (wherein G is the primary magnetic field intensity, and $\theta$ is the view angle). The ordinary sequence of observing the subject has been performed up to this point.

Upon the elapse of a certain period of time, an RF pulse 180° (FIG. 6, line a) for rotating the spins through 180° is applied in order to observe a second echo signal (FIG. 6, line e). Thereafter, the gradient magnetic field Gx (FIG. 6, line d) in the x direction and the gradient magnetic field Gy (FIG. 6, line c) in the y direction are eliminated at a time t when the second echo signal is at a maximum, and the echo signal 200 (FIG. 6, line e) is observed to measure the primary magnetic field.

Where the variation of the primary magnetic field intensity is relatively gradual (about several ppm in several tens of seconds) it is not necessary to effect the sequence of measuring the primary magnetic field in all of the views. The primary magnetic field intensity may be measured in views at suitable intervals, and interpolated values may be used for the other views, thus shortening the time required for observing the data on the subject. With the Fourier method (spin warp method) having the pulse sequence shown in FIG. 6, the signal becomes smaller in views having greater amounts of warp. Thus, it is preferable to disperse views with smaller amounts of warp appropriately in one scanning cycle, measure the primary magnetic field intensity only in those views, and use values obtained by interpolating the measured values for the other views.

Where the pulse sequence of FIG. 7 is employed, the signal for measuring the magnetic field does not become smaller in views with greater amounts of warp, and hence it is possible to measure the magnetic field in any view.

The pulse sequence of FIG. 7, will now be described. The gradient magnetic field Gz (FIG. 7, line b) in the z direction and a 90° RF pulse (FIG. 7, line a) are applied to selectively excite the spins in a certain sliced plane of the subject. Then, the phase is encoded by the gradient magnetic field Gy (FIG. 7, line c) and simultaneously the gradient magnetic field Gx (FIG. 7, line d) is applied in preparation for observing an echo.

Then, the application of the gradient magnetic field is stopped, and the spins are reversed by applying a first 180° pulse (FIG. 7, line a). Then, while the gradient magnetic field Gx is being applied as shown in FIG. 7, line d, an echo signal $100_1$ generated as shown in FIG. 7, line e, is detected by the receiving coil and observed. The gradient magnetic field Gx (FIG. 7, line d) is applied for a time period of 2 Tpr.

Subsequently, the application of the gradient magnetic field is stopped, and the spins are reversed by applying a second 180° pulse (FIG. 7, line a). Then, a warp gradient field $-Gwa$ (FIG. 7, line c) opposite in polarity to the applied gradient field Gy ($+Gwa$) is applied to bring the spins into phase in the y direction. At the same time, the gradient magnetic field Gx is applied to bring the spins into phase in the x direction (as a result, the spins are brought in to the same condition as that immediately after the excitation, providing the effect of relaxation is neglected). After the gradient magnetic fields Gy, Gx have been applied for time period of Tpr, the application of these fields is stopped and an echo signal $200_1$ (FIG. 7, line e) (for measuring the magnetic field) is observed. In the above pulse sequence, the magnitude of the signal for measuring the magnetic field is not affected by the amount of warp.

While the above embodiments use 180° pulses to generate an echo, for measuring the primary magnetic field, other methods may be used, such as, for example, by reversing the direction of the gradient magnetic fields.

The invention is capable of measuring time dependent variations of the primary magnetic field intensity, and hence of preventing artifacts from being generated due to variations in the primary magnetic field intensity. Thus, advantageously, the measurement of the primary magnetic field density is not affected by movement of the subject.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. An NMR diagnostic apparatus comprising
    means for applying a primary magnetic field to a subject;
    means for applying RF pulses to the subject to give nuclear magnetic resonance to the nuclei of atoms in the subject;
    means for applying gradient magnetic fields to project an NMR signal of the nuclei at least in one direction;
    means for observing the NMR signal projected by said gradient magnetic fields applying means; and
    arithmetic means for constructing a distribution of information on resonance energy as an image from an output signal from said observing means; wherein
    said gradient magnetic fields applying means comprises means for applying the gradient magnetic fields at a predetermined time and for not applying the gradient magnetic fields at another predetermined time, during the time period of one view; and wherein
    said gradient magnetic fields applying means further comprises means for measuring the NMR signal during said predetermined time when said gradient magnetic fields are applied, and means for measuring the intensity of said primary magnetic field during said other predetermined time when no gradient magnetic fields are applied.

2. The apparatus of claim 1, wherein said means for observing comprises means for setting a particular frequency associated with the intensity of said primary magnetic field based on the NMR signal of the entire sectional plane of the subject being observed when the intensity of said primary magnetic field is measured during the period when the application of said gradient magnetic field is stopped; and wherein said means for applying the primary magnetic field comprises means for controlling the intensity of the magnetic field applied to the subject based on said particular frequency.

3. The apparatus of claim 1, wherein said means for observing comprises means for setting a particular frequency associated with the intensity of said primary magnetic field based on the NMR signal of the entire sectional plane of the subject being observed when the intensity of said primary magnetic field is measured during the period when the application of said gradient magnetic field is stopped, means for phase-detecting the observed NMR signal of the subject by referring to a reference frequency, and means for controlling said reference frequency based on said particular frequency.

4. The apparatus of claim 1, wherein said means for observing comprises means for setting a particular frequency associated with the intensity of said primary magnetic field based on the NMR signal of the entire sectional plane of the subject being observed when the intensity of said primary magnetic field is measured during the period when the application of said gradient magnetic field is stopped; and wherein said arithmetic means comprises means for correcting a computed value based on said particular frequency.

5. The apparatus of claim 1, wherein said means for observing comprises means for setting a particular frequency associated with the intensity of said primary magnetic field based on the NMR signal of the entire sectional plane of the subject being observed when the intensity of said primary magnetic field is measured during the period when the application of said gradient magnetic field is stopped, means for phase-detecting the observed NMR signal of the subject by referring to a reference frequency, and means for controlling said reference frequency based on said particular frequency; and wherein said arithmetic means comprises means for correcting a computed value based on said particular frequency.

* * * * *